United States Patent
Hur

(10) Patent No.: US 7,987,402 B2
(45) Date of Patent: Jul. 26, 2011

(54) SEMICONDUCTOR MEMORY DEVICE HAVING BURN-IN TEST MODE AND METHOD FOR DRIVING THE SAME

(75) Inventor: Hwang Hur, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 789 days.

(21) Appl. No.: 12/005,445

(22) Filed: Dec. 26, 2007

(65) Prior Publication Data

US 2009/0006912 A1  Jan. 1, 2009

(30) Foreign Application Priority Data

Jun. 27, 2007  (KR) .................. 10-2007-0063716

(51) Int. Cl.
 G01R 31/28 (2006.01)
 G06F 11/00 (2006.01)
 G11C 29/00 (2006.01)
 G11C 7/00 (2006.01)
(52) U.S. Cl. ....................... 714/738; 714/718
(58) Field of Classification Search .................. 714/738, 714/718, 721, 725–729, 731, 733–734, 739, 714/741, 742, 744, 799, 25, 30, 42, 57–48; 365/200, 201
See application file for complete search history.

(56) References Cited

U.S. PATENT DOCUMENTS

| | | | |
|---|---|---|---|
| 5,553,025 A | 9/1996 | Haraguchi | |
| 6,731,551 B2 * | 5/2004 | Pekny | 365/201 |
| 6,834,366 B2 * | 12/2004 | Kim et al. | 714/734 |
| 6,842,033 B1 | 1/2005 | Kim et al. | |
| 7,505,337 B2 * | 3/2009 | Nowak et al. | 365/200 |

FOREIGN PATENT DOCUMENTS

| | | |
|---|---|---|
| JP | 01-173499 | 10/1989 |
| JP | 2004-045090 | 2/2004 |
| KR | 2002-0058992 | 7/2002 |
| KR | 2005-0065689 | 6/2005 |

* cited by examiner

*Primary Examiner* — Christine T Tu

(74) *Attorney, Agent, or Firm* — Blakely, Sokoloff, Taylor & Zafman

(57) ABSTRACT

A semiconductor memory device includes: a pattern selector configured to receive a first test control signal and a second test control signal to output a plurality of pattern selection signals and a selection end signal in response to an entry signal; a shifting controller configured to receive the first test control signal and the second test control signal to output a shifting control signal in response to the selection end signal; and a pattern test signal generator configured to select a stress pattern corresponding to the pattern selection signals to generate a plurality of test mode signals for controlling a sequential entry into a plurality of test modes for executing the stress pattern in response to the shifting control signal.

25 Claims, 5 Drawing Sheets

SEMICONDUCTOR MEMORY DEVICE HAVING BURN-IN TEST MODE AND METHOD FOR DRIVING THE SAME

CROSS-REFERENCE TO RELATED APPLICATIONS

The present invention claims priority of Korean patent application number 10-2007-0063716, filed on Jun. 27, 2007, which is incorporated by reference in its entirety.

BACKGROUND OF THE INVENTION

The present invention relates to a semiconductor device, and more particularly, to a semiconductor memory device having a burn-in test mode and a method for driving the same.

In the fabrication of semiconductor memory devices, a stress mode is widely used as a test process for increasing the reliability of memory cells.

In particular, a stress mode at a wafer level is called a wafer burn-in process. The wafer burn-in process is to apply a stress to a core region of a DRAM at a relatively high temperature to induce the generation of defects in a weak core region in an early stage. Then, the defects are repaired in a probe test. In addition, the process of applying the stress to the core region of the DRAM includes a process of applying a stress to a cell and a process of applying a stress to a bit line. The two processes can be implemented with simple logic.

In executing the stress pattern, the test modes are sequentially set in each step to perform the stress process. Separate codes are assigned in each test mode. In other words, in addition to a wafer burn-in test mode entry pad and an internal bias forcing pad, another pad is necessary for inputting a separate operation code for entry into the test mode defining each step. The operation code uses a data pad or address pad.

Table 1 below shows operation codes for each mode in a conventional wafer burn-in test.

TABLE 1

| MODE | A<0> | A<1> | A<2> | A<3> |
|------|------|------|------|------|
| TM0  | H    | L    | L    | L    |
| TM1  | H    | H    | L    | L    |
| TM2  | H    | L    | H    | L    |
| TM3  | H    | H    | H    | L    |
| TM4  | H    | L    | L    | H    |
| TM5  | H    | H    | L    | H    |
| TM6  | H    | L    | H    | H    |
| TM7  | H    | H    | H    | H    |

The order of the test modes according to the test pattern will be described below.

A cell stress pattern has a procedure of TM2→TM3→apply a logic low level to a cell data→TM2→apply a logic high level→TM2→TM3→apply a logic low level→TM3→apply a logic high level.

An oxide-nitride-oxide (ONO) stress pattern has a procedure of TM2→TM3→apply a logic low level→apply a bias→TM2→TM3→apply a logic high level→apply a logic low level.

A first bit line stress pattern has a procedure of TM7→apply a logic low level→apply a logic high level→apply a logic low level→apply a logic high level.

A second bit line stress pattern has a procedure of TM4→apply a logic low level→TM5→apply a logic high level→TM1→TM6.

As shown in Table 1, the operation codes for each test mode are applied through four address pads. For example, all the addresses A<0:3> must be applied with a logic high level in order to enter into the test mode TM7.

Meanwhile, a test apparatus reduces test time by testing a plurality of dies one time. Because the number of channels of the test apparatus is limited, the number of pads necessary for the test must be reduced so as to test a large number of dies at one time.

A built-in self test (BIST) is widely used in a memory cell test in a conventional ASIC. The built-in self test has an advantage in that a large number of pads are not used because it does not directly access a memory cell from the outside. However, the patterns that can be tested in the built-in self test are complicated. To this end, logic circuits must be added, thus increasing the layout area. Therefore, the built-in self test is difficult to apply to memory devices in which a net die is important. The net die is defined by number of dies per wafer.

In the wafer burn-in test, a probe card is separately manufactured and a stress is applied to a plurality of dies by one-time test. However, because the number of pads for testing one pad increases, the number of dies to which a stress is applied at a time decreases due to the limited channels of the test apparatus.

Therefore, because the number of pads necessary for the burn-in test mode is large, the number of dies that can be tested one time is small, thus increasing the test time.

SUMMARY OF THE INVENTION

Embodiments of the present invention are directed to providing a semiconductor memory device that can reduce the number of pads necessary for a test, thereby reducing the test time.

In accordance with an aspect of the present invention, there is provided a semiconductor memory device, including: a pattern selector configured to receive a first test control signal and a second test control signal to output a plurality of pattern selection signals and a selection end signal in response to an entry signal; a shifting controller configured to receive the first test control signal and the second test control signal to output a shifting control signal in response to the selection end signal; and a pattern test signal generator configured to select a stress pattern corresponding to the pattern selection signals to generate a plurality of test mode signals for controlling a sequential entry into a plurality of test modes for executing the stress pattern in response to the shifting control signal.

In accordance with an aspect of the present invention, there is provided a method for driving a semiconductor memory device, including activating a flag signal indicating an entry into a wafer burn-in test; selecting a stress pattern in response to a first test control signal and a second test control signal during the activation of the flag signal; and controlling a sequentially entry into a plurality of test modes for executing the selected stress pattern.

DESCRIPTION OF SPECIFIC EMBODIMENTS

Hereinafter, a semiconductor memory device having a burn-in test mode in accordance with the present invention will be described in detail with reference to the accompanying drawings.

Figure 1:
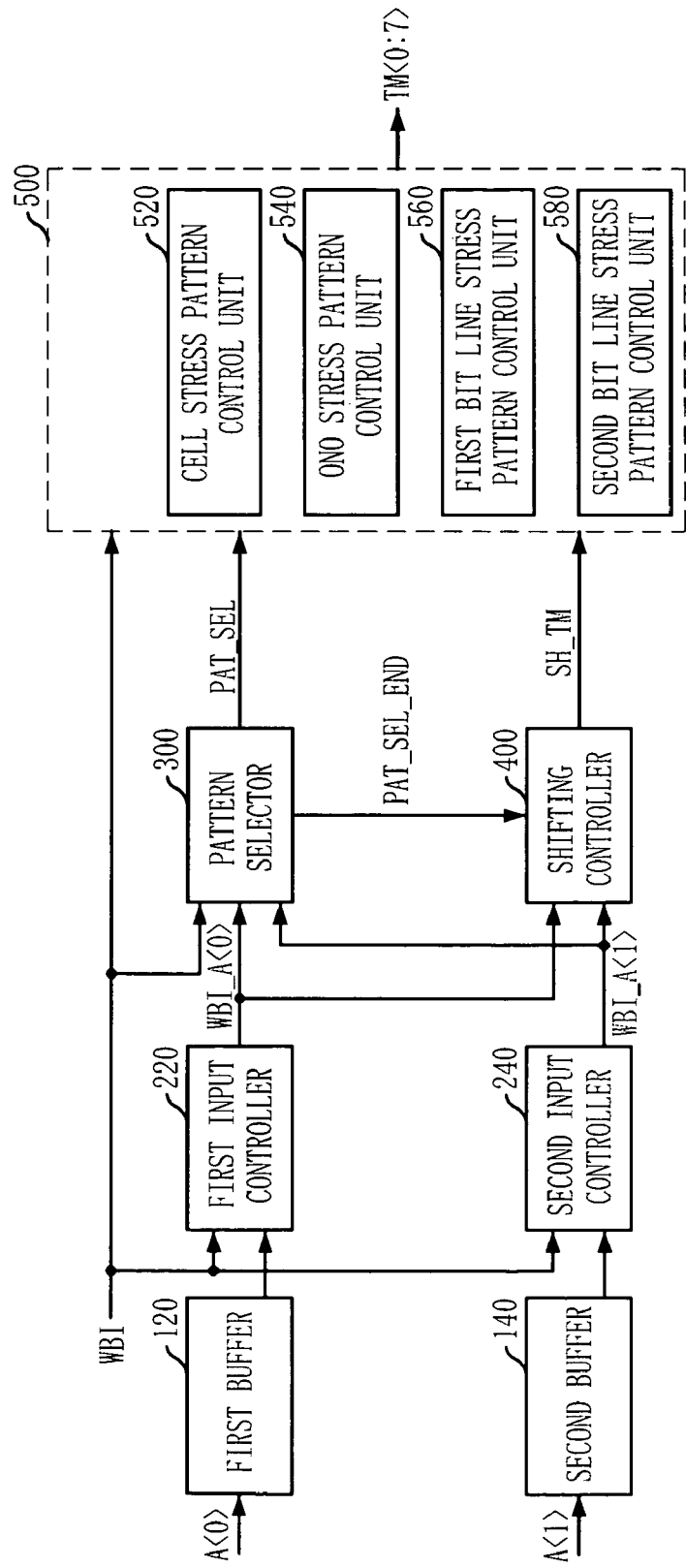
FIG. 1 is a block diagram of a semiconductor memory device having a burn-in test mode in accordance with an embodiment of the present invention.

FIG. 1 is a block diagram of a semiconductor memory device having a burn-in test mode in accordance with an embodiment of the present invention.

As shown, the semiconductor memory device includes a first buffer 120, a second buffer 140, a first input controller 220, a second input controller 240, a pattern selector 300, a shifting controller 400, and a pattern test signal generator 500.

The first buffer 120 receives a first address A<0> and the second buffer 140 receives a second address A<1>. The first input controller 220 receives an output signal of the first buffer 120 to output a first test control signal WBI_A<0> in response to an entry signal WBI, and the second input controller 240 receives an output signal of the second buffer 140 to output a second test control signal WBI_A<1> in response to the entry signal WBI. The pattern selector 300 receives the first test control signal WBI_A<0> and the second test control signal WBI_A<1> to output a pattern selection signal group PAT_SEL<0:3> and a selection end signal PAT_SEL_END in response to the entry signal WBI. The shifting controller 400 receives the second test control signal WBI_A<1> to output a shifting control signal SH_TM in response to the selection end signal PAT_SEL_END. The pattern test signal generator 500 selects a stress pattern corresponding to the pattern selection signal group PAT_SEL<0:3> and generates a test mode signal group TM<0:7> for controlling a sequential entry into the test mode in response to the shifting control signal SH_TM.

The pattern test signal generator 500 includes a cell stress pattern control unit 520, an oxide-nitride-oxide (ONO) stress pattern control unit 540, a first bit line stress pattern control unit 560, and a second bit line stress pattern control unit 580.

The cell stress pattern control unit 520 is enabled in response to a first pattern selection signal PAT_SEL<0> of the pattern selection signal group PAT_SEL<0:3> to activate third and fourth test mode signals TM<2:3> for applying a stress to a cell whenever the shifting control signal SH_TM is inputted. The ONO stress pattern control unit 540 is enabled in response to a second pattern selection signal PAT_SEL<1> to activate the third and fourth test mode signals TM<2:3> for applying a stress to a gate electrode whenever the shifting control signal SH_TM is inputted. The first bit line stress pattern control unit 560 is enabled in response to a third pattern selection signal PAT_SEL<2> to activate a eighth test mode signal TM<7> for applying a stress to a bit line whenever the shifting control signal SH_TM is inputted. The second bit line stress pattern control unit 580 is enabled in response to a fourth pattern selection signal PAT_SET<3> to activate second and fifth to seventh test mode signals TM<1> and TM<4:6> for applying a stress to the bit line whenever the shifting control signal SH_TM is inputted.

For reference, the entry signal WBI is generated by decoding a signal applied through a pad for setting an external input/output. For example, a pad for receiving signals such as X4 and X8. The entry signal WBI is a flag signal indicating the entry into the wafer burn-in test.

The first and second addresses A<0:1> of a 2-bit address are inputted during the activation of the entry signal WBI indicating the entry into the burn-in test, and a burn-in test pattern is selected. That is, the control unit within the pattern test signal generator 500 is enabled to sequentially activate the test mode signals for executing the selected test pattern. Therefore, a small number of pads are used because only 2-bit address pads are used for selecting the test pattern and testing the selected pattern. For example, the test pattern is selected through the toggling of the first address A<0> and the entry point of each test mode is determined through the toggling of the second address A<1>.

Figure 2:
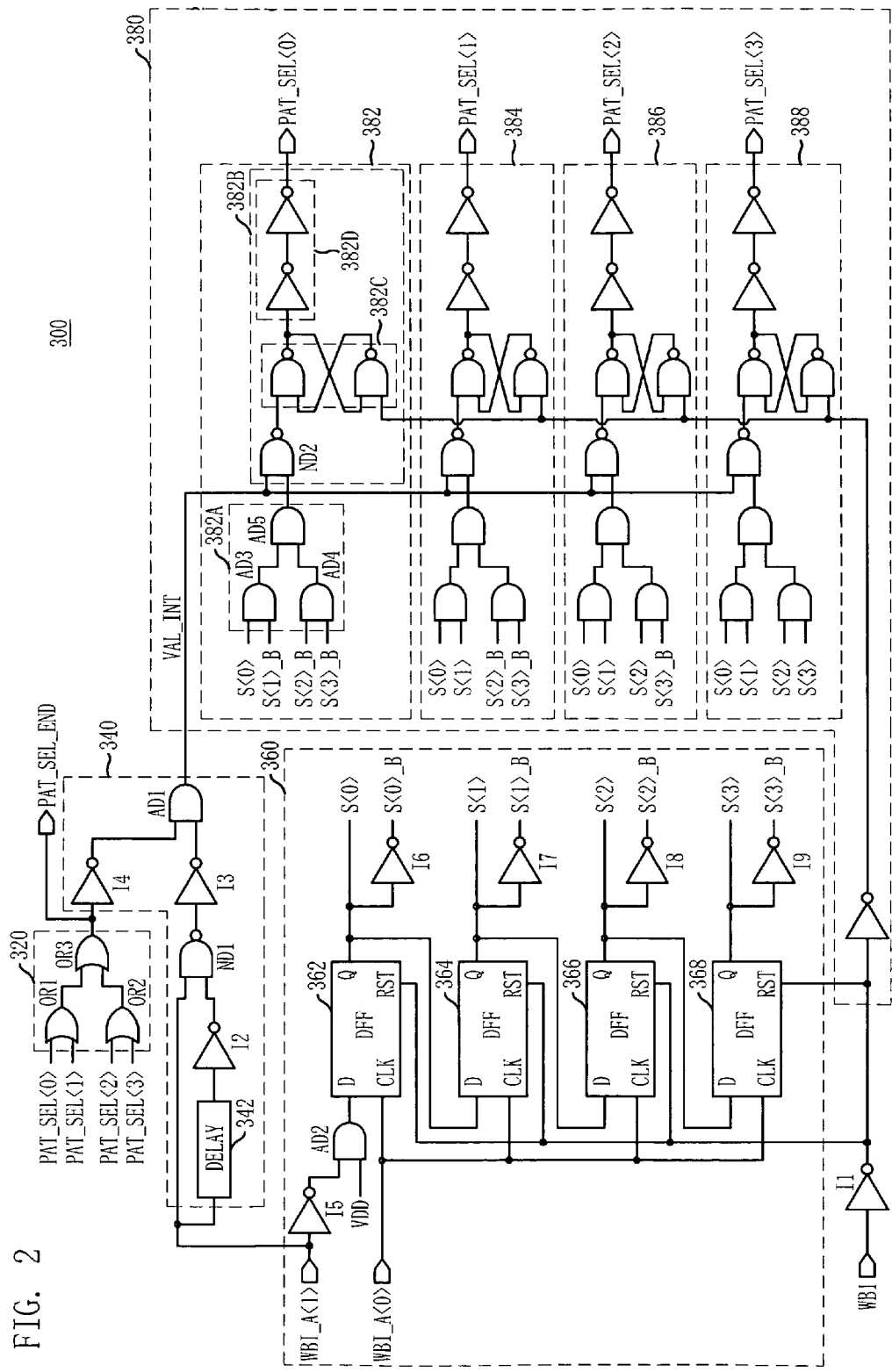
FIG. 2 is a block diagram of a pattern selector illustrated in FIG. 1.

FIG. 2 is a block diagram of the pattern selector 300 illustrated in FIG. 1.

As shown, the pattern selector 300 includes an end signal generating unit 320, a valid interval control unit 340, a decoding unit 360, and a selection signal generating unit 380.

The end signal generating unit 320 generates the selection end signal PAT_SEL_END in response to the pattern selection signal group PAT_SEL<0:3>. The valid interval control unit 340 activates a valid interval signal VAL_INT in response to the second test control signal WBI_A<1> and deactivates the valid interval signal VAL_INT in response to the selection end signal PAT_SEL_END. The decoding unit 360 is initialized in response to an inverted entry signal and generating decoding signal groups S<0:3> and S<0:3>_B according to the number of toggling of the first test control signal WBI_A<0> (Hereinafter, referring to as "a toggling number of the first test control signal WBI_A<0>") during an activation of the second test control signal WBI_A<1>. The selection signal generating unit 380 generates the pattern selection signal group PAT_SEL<0:3> in response to the decoding signal groups S<0:3> and S<0:3>_B and the valid interval signal VAL_INT, and deactivates the pattern selection signal group PAT_SEL<0:3> during a deactivation of the entry signal WBI.

In detail, the end signal generating unit 320 includes a first OR gate OR1 configured to receive the first and second pattern selection signals PAT_SEL<0> and PAT_SEL<1>, a second OR gate OR2 configured to receive the third and fourth pattern selection signals PAT_SEL<2> and PAT_SEL<3>, and a third OR gate OR3 configured to receive output signals of the first OR gate OR1 and the second OR gate OR2 to generate the selection end signal PAT_SEL_END. That is, the end signal generating unit 320 activates the selection end signal PAT_SEL_END to a logic high level when one of the pattern selection signal group PAT_SEL<0:3> is activated.

The valid interval control unit 340 includes a delay element 342 configured to delay the second test control signal WBI_A<1>, a first inverter I2 configured to invert an output signal of the delay element 342, a first NAND gate ND1 configured to receive an output signal of the inverter I2 and the second test control signal WBI_A<1>, a second inverter I3 configured to invert an output signal of the first NAND gate ND1, a third inverter I4 configured to invert the selection end signal PAT_SEL_END, and a first AND gate AD1 configured to receive output signals of the second and third inverters I3 and I4 to output the valid interval signal VAL_INT. Accordingly, the valid interval control unit 340 delays the second test control signal WBI_A<1> by a delay time of the delay element 342 and then outputs the delayed signal as the valid interval signal VAL_INT in response to the selection end signal PAT_SEL_END.

The decoding unit 360 include a fourth inverter I5 configured to invert the second test control signal WBI_A<1>, a second AND gate AD2 configured to an output signal of the fourth inverter I5 and a power supply voltage VDD, first to fourth D flip-flops 362, 364, 366 and 368 reset in response to the inverted entry signal and connected in series to receive an output signal of the second AND gate AD2 as a data input in synchronization with the first test control signal WBI_A<0> to output the decoding signal group S<0:3>, and fifth to eighth inverters I6, I7, I8 and I9 configured to invert the decoding signal group S<0:3> to output the decoding signal group S<0:3>_B.

Accordingly, the decoding unit 360 activates the decoding signal groups S<0:3> and S<0:3>_B according to the toggling number of the first test control signal WBI_A<0> while the second test control signal WBI_A<1> is in the activated state of a logic high level.

In FIG. 2, the entry signal WBI is inverted by a ninth inverter I1.

The selection signal generating unit 380 includes a first pattern signal generating unit 382, a second pattern signal generating unit 384, a third pattern signal generating unit 386, and a fourth pattern signal generating unit 388.

The first pattern signal generating unit 382 activates the first pattern selection signal PAT_SEL<0> in response to the activation of the decoding signals S<0> and S<1:3>_B and deactivates the first pattern selection signal PAT_SEL<0> in response to the deactivation of the entry signal WBI. The second pattern signal generating unit 384 activates the second pattern selection signal PAT_SEL<1> in response to the activation of the decoding signals S<0:1> and S<2:3>_B and deactivates the second pattern selection signal PAT_SEL<1> in response to the deactivation of the entry signal WBI. The third pattern signal generating unit 386 activates the third pattern selection signal PAT_SEL<2> in response to the activation of the decoding signals S<0:2>_B and S<3>_B and deactivates the third pattern selection signal PAT_SEL<2> in response to the deactivation of the entry signal WBI. The fourth pattern signal generating unit 388 activates the fourth pattern selection signal PAT_SEL<3> in response to the activation of the decoding signals S<0:3> and deactivates the fourth pattern selection signal PAT_SEL<3> in response to the deactivation of the entry signal WBI.

Since the first to fourth selection signal generating units 382, 384, 386 and 388 have substantially the same circuit configuration except for the inputted decoding signals S<0:3> or S<0:3>_B, the following description will be focused on only the first selection signal generating unit 382.

The first selection signal generating unit 382 includes an input control unit 382A configured to output a first input signal in response to the activation of the decoding signals S<0> and S<1:3>_B, and a signal generating unit 382B configured to output the first input signal as the first pattern selection signal PAT_SEL<0> during the activation of the valid interval signal VAL_INT.

The input control unit 382A includes a third AND gate AD3 configured to receive the decoding signals S<0> and S<1>_B, a fourth AND gate AD4 configured to receive the decoding signals S<2:3>_B, and a fifth AND gate AD5 configured to receive output signals of the third and fourth AND gates AD3 and AD4 to output the first input signal.

The signal generating unit 382B includes a second NAND gate ND2 configured to receive the valid interval signal VAL_INT and the first input signal, an RS latch 382C configured to receive an output signal of the second NAND gate ND2 as a set signal and the entry signal WBI as a reset signal, and an inverter chain 382D configured to delay a Q output of the RS latch 382C to output the first pattern selection signal PAT_SEL<0>.

Hereinafter, an operation of the pattern selector 300 will be described.

When the entry signal WBI is activated, the second address A<1> is locked to a logic low level. After the first address A<0> is toggled predetermined times, the pattern of the corresponding stress test is selected when the second address A<1> is activated to a logic high level.

For example, when the first address A<0> is toggled one time, the first pattern selection signal PAT_SEL<0> for selecting the cell stress pattern is activated. When the first address A<0> is toggled two times, the second pattern selection signal PAT_SEL<1> for selecting the ONO stress pattern is activated. When the first address A<0> is toggled three times, the third pattern selection signal PAT_SEL<2> for selecting the first bit line stress pattern is activated. When the first address A<0> is toggled four times, the fourth pattern selection signal PAT_SEL<3> for selecting the second bit line stress pattern is activated.

A procedure of activating the first pattern selection signal PAT_SEL<0> for selecting the cell stress pattern will be described below.

Since the second address A<1> has a logic low level when the entry signal WBI is activated, the second test control signal WBI_A<1> has a logic low level. Since the first address A<0> is toggled one time, the first test control signal WBI_A<0> is activated in a single pulse form.

The decoding unit 360 transfers the second test control signal WBI_A<1> as many as the toggling number of the first test control signal WBI_A<0> to activate the decoding signal groups S<0:3> and S<0:3>_B. Since the first test control signal WBI_A<0> is toggled one time, the decoding signals S<0> and S<1:3>_B are activated to a logic high level and the decoding signals S<1:3> and S<0>_B are deactivated to a logic low level.

The second address A<1> is activated to a logic high level, the second test control signal WBI_A<1> is activated to a logic high level. Therefore, the valid interval control unit 340 activates the valid interval signal VAL_INT to a logic high level in response to a rising edge of the second test control signal WBI_A<1>.

The input control unit 382A of the first selection signal generating unit 382 activates the first input signal to a logic high level in response to the activation of the decoding signals S<0> and S<1:3>_B. The signal generating unit 382B activates the first pattern selection signal PAT_SEL<0> to a logic high level in response to the activation of the first input signal and the valid interval signal VAL_INT.

The end signal generating unit 320 activates the selection end signal PAT_SEL_END to a logic high level in response to the activation of the first pattern selection signal PAT_SEL<0>.

The valid interval control unit 340 deactivates the valid interval signal VAL_INT to a logic low level in response to the selection end signal PAT_SEL_END. The signal generating unit 382B maintains the first pattern selection signal PAT_SEL<0> to a logic low level in response to the deactivation of the valid interval signal VAL_INT.

As described above, when the first test control signal WBI_A<0> is activated to a logic high level after toggling the second test control signal WBI_A<1> during the activation of the entry signal WBI, the pattern selector 300 activates the corresponding signals of the pattern selection signal group PAT_SEL<0:3> for selecting the test pattern.

Figure 3:
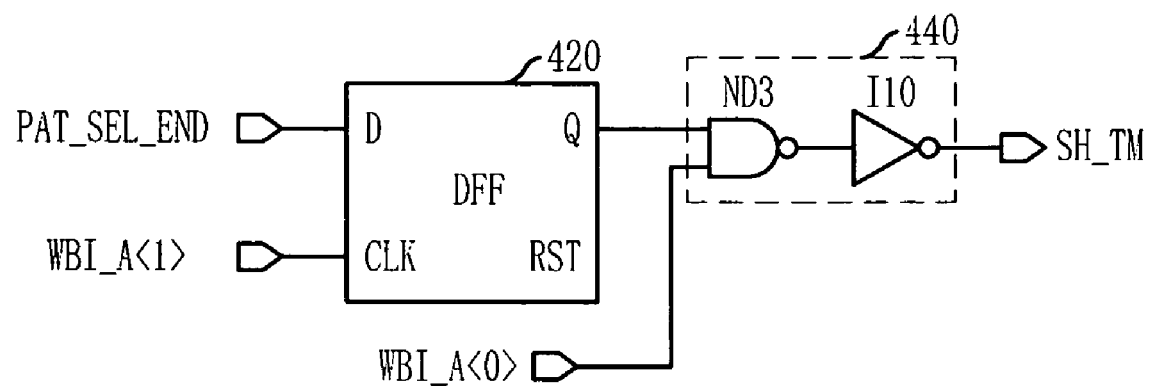
FIG. 3 is a circuit diagram of a shifting controller illustrated in FIG. 1.

FIG. 3 is a circuit diagram of the shifting controller 400 illustrated in FIG. 1.

As shown, the shifting controller 400 includes a D flip-flop 420 and a signal output unit 440. The D flip-flop 420 latches the selection end signal PAT_SEL_END in response to the second test control signal WBI_A<1>. The signal output unit 440 outputs a Q output of the D flip-flop 420 as the shifting control signal SH_TM in response to the first test control signal WBI_A<0>.

The signal output unit 440 includes a NAND gate ND3 configured to receive the Q output of the D flip-flop 420 and the first control signal WBI_A<0>, and an inverter I10 configured to invert an output signal of the NAND gate ND3 to output the shifting control signal SH_TM.

Upon operation, the D flip-flop 420 activates the Q output when the selection end signal PAT_SEL_END is activated and the second test control signal WBI_A<1> is toggled. The signal output unit 440 activates the shifting control signal SH_TM in a pulse form during the activation of the first test control signal WBI_A<0>. That is, the shifting controller 400 activates the shifting control signal SH_TM during the activation of the selection end signal PAT_SEL_END whenever the second test control signal WBI_A<1> is toggled.

Although the shifting controller 400 controls the shifting timing using the external control signals, it can control the entry point of each test mode using an internal timer because each test mode has time in unit of second. However, the internal timer is inappropriate because the wafer burn-in test conditions may change in the development step of specific products. On the other hand, when the development of the products is completed and thus the wafer burn-in test conditions are fixed, the internal timer is advantageous when the longest transition time is a few milliseconds.

Figure 4:
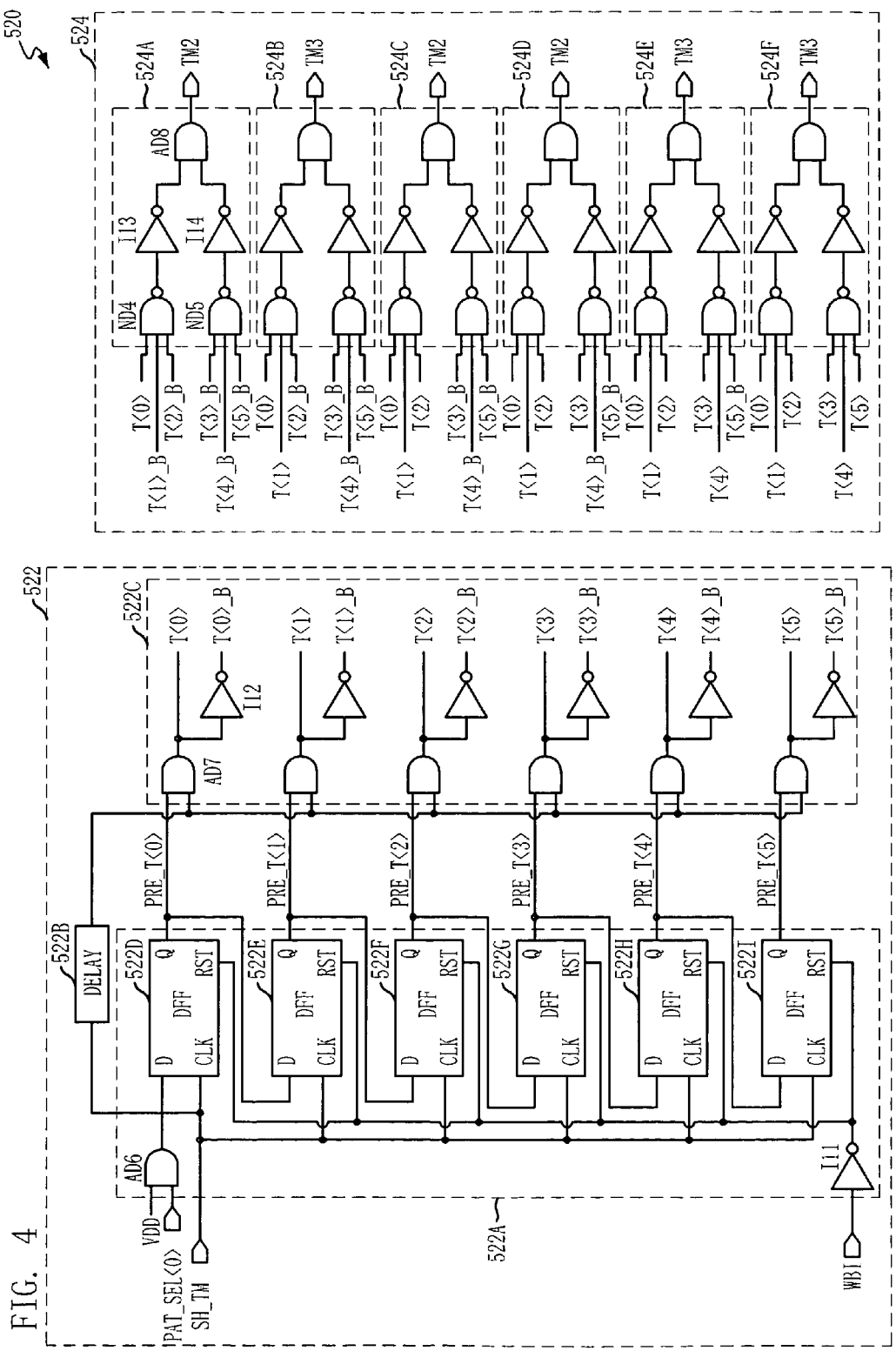
FIG. 4 is a circuit diagram of a cell stress pattern control unit illustrated in FIG. 1.

FIG. 4 is a circuit diagram of the cell stress pattern control unit 520 illustrated in FIG. 1. The cell stress pattern control unit 520, the ONO stress pattern control unit 540, the first bit line stress pattern control unit 560, and the second bit line stress pattern control unit 580 have substantially the same circuit configuration except for the order of test mode signals. Therefore, only the cell stress pattern control unit 520 will be described below.

Referring to FIG. 4, the cell stress pattern control unit 520 includes a driving order control unit 522 and a cell stress mode signal generating unit 524. The driving order control unit 522 is reset in response to the entry signal WBI and generates driving order signal groups T<0:5> and T<0:5>_B in response to the toggling of the shifting control signal SH_TM during the activation of the first pattern selection signal PAT_SEL<0>. The cell stress mode signal generating unit 524 outputs the test mode signal group TM<0:7> in response to the driving order signal groups T<0:5> and T<0:5>_B.

The driving order control unit 522 includes a pre-order signal generating unit 522A, a delay unit 522B, and an output control unit 522C. The pre-order signal generating unit 522A sequentially activates a pre-order signal group PRE_T<0:5> in response to the toggling of the shifting control signal SH_TM during the activation of the first pattern selection signal PAT_SEL<0>. The delay unit 522B delays the shifting control signal SH_TM by a predetermined time. The output control unit 522C outputs the pre-order signal group PRE_T<0:5> as the driving order signal groups T<0:5> and T<0:5>_B in response to an output signal of the delay unit 522B.

The pre-order signal generating unit 522A includes a first AND gate AD6 configured to receive the first pattern selection signal PAT_SEL<0> and the power supply voltage VDD, a first inverter I11 configured to invert the entry signal WBI, and first to sixth D flip-flops 522D, 522E, 522F, 522G, 522H and 522I reset in response to an output signal of the first inverter I11 and connected in series to receive an output signal of the first AND gate AD6 or an output signal of a previous stage to output the pre-order signal group PRE_T<0:5> in synchronization with the shifting control signal SH_TM. That is, the pre-order signal generating unit 522A sequentially activates the pre-order signal group PRE_T<0:5> during the activation of the first pattern selection signal PAT_SEL<0> whenever the shifting control signal SH_TM is toggled.

The output control unit 522C is configured to output the pre-order signal group PRE_T<0:5> as the driving order signal groups T<0:5> and T<0:5>_B in response to the output signal of the delay unit 522B.

For example, for a first pre-order signal PRE_T<0>, the output control unit 522C includes a second AND gate AD7 configured to receive the output signal of the delay unit 522B and the first pre-order signal PRE_T<0> to output a driving order signal T<0>, and a second inverter I12 configured to invert an output signal of the second AND gate AD7 to output a driving order signal T<0>_B.

The test mode signal generating unit 524 includes a plurality of mode signal generating units 524A, 524B, 24C, 524D, 524E and 524F configured to output the test mode signal group TM<0:7> in response to the first and second driving order signal groups T<0:5> and T<0:5>_B. Since the mode signal generating units 524A, 524B, 24C, 524D, 524E and 524F have substantially the same circuit configuration, only one mode signal generating unit will be described below.

The mode signal generating unit 524A includes a first NAND gate ND4 configured to receive the driving order signals T<0> and T<1:2>_B, a third inverter I13 configured to invert an output signal of the first NAND gate ND4, a second NAND gate ND5 configured to receive the driving order signals T<3:5>_B, a fourth inverter I14 configured to invert an output signal of the second NAND gate ND5, and a third AND gate AD8 configured to receive output signals of the inverters I13 and I14 to output the third test mode signal TM<2>.

The mode signal generating unit 524A activates the third test mode signal TM<2> to a logic high level when the driving order signals T<0> and T<1:5>_B have a logic high level.

Next, an operation of the cell stress pattern control unit 520 will be described below.

The pre-order signal generating unit 522A activates the first pre-order signal PRE_T<0> to a logic high level during the activation of the first pattern selection signal PAT_SEL<0> in response to the first toggling of the shifting control signal SH_TM.

The delay unit 522B delays the shifting control signal SH_TM by a delay time of the D flip-flop.

The output control unit 522C outputs the first pre-order signal PRE_T<0> as the driving order signals T<0> and T<0>_B in response to the activation of the output signal of the delay unit 522B. At this point, the driving order signal T<0> is activated to a logic high level, and the driving order signal T<0>_B is activated to a logic low level. In addition, the driving order signals T<1:5> are deactivated to a logic low level, and the driving order signals T<1:5>_B are deactivated to a logic high level.

The first mode signal generating unit 524A activates the third test mode signal TM<2> to a logic high level in response to the logic high levels of the driving order signals T<0> and T<1:5>_B.

The first step for the cell stress pattern is performed by the third test mode signal TM<2>.

The pre-order signal generating unit 522A activates a second pre-order signal PRE_T<1> to a logic high level during the first pattern selection signal PAT_SEL<0> in response to the second toggling of the shifting control signal SH_TM. At this point, the first pre-order signal PRE_T<0> also maintains a logic high level.

The delay unit 522B delays the shifting control signal SH_TM, and the output control unit 522C outputs the second pre-order signal PRE_T<1> as the driving order signals T<1> and T<1>_B in response to the activation of the output signal of the delay unit 522B. At this point, the driving order signal T<1> is activated to a logic high level, and the driving order signal T<1>_B is activated to a logic low level. In addition, the driving order signals T<2:5> are deactivated to a logic low level, and the driving order signals T<2:5>_B are deactivated to a logic high level.

The second mode signal generating unit 524B activates the fourth test mode signal TM<3> to a logic high level in response to the logic high levels of the driving order signals T<0:1> and T<2:5>_B. The second step for the cell stress pattern is performed by the fourth test mode signal TM<3>. A cell data of a logic low level is inputted.

In addition, the first mode signal generating unit 524A deactivates the test mode signal TM<2> to a logic low level in response to the logic low level of the driving order signal T<1>_B.

In this way, the third and fourth test mode signals TM<2:3> are activated according to the toggling of the shifting control signal SH_TM and the cell stress pattern is driven.

When the entry signal WBI is deactivated, the driving order control unit 522 deactivates the driving order signal group T<0:5> to a logic low level and the driving order signal group T<0:5>_B to a logic high level. Then, the cell stress mode signal generating unit 524 deactivates the test mode signal group TM<0:7> to a logic low level, thereby ending the driving of the cell stress pattern.

Meanwhile, the order of the test mode signals generated by the cell stress pattern control unit 520 is as follows: TM2→TM3→TM2→TM2→TM3→TM3. This indicates the test mode step necessary for driving the conventional cell stress pattern. More specifically, this step has a procedure of TM2→TM3→apply a logic low level to a cell data→TM2→apply a logic high level→TM2→TM3→apply a logic low level→TM3→apply a logic high level.

That is, the cell stress pattern can be normally driven by the test mode signals generated by the cell stress pattern control unit 520.

Figure 5:
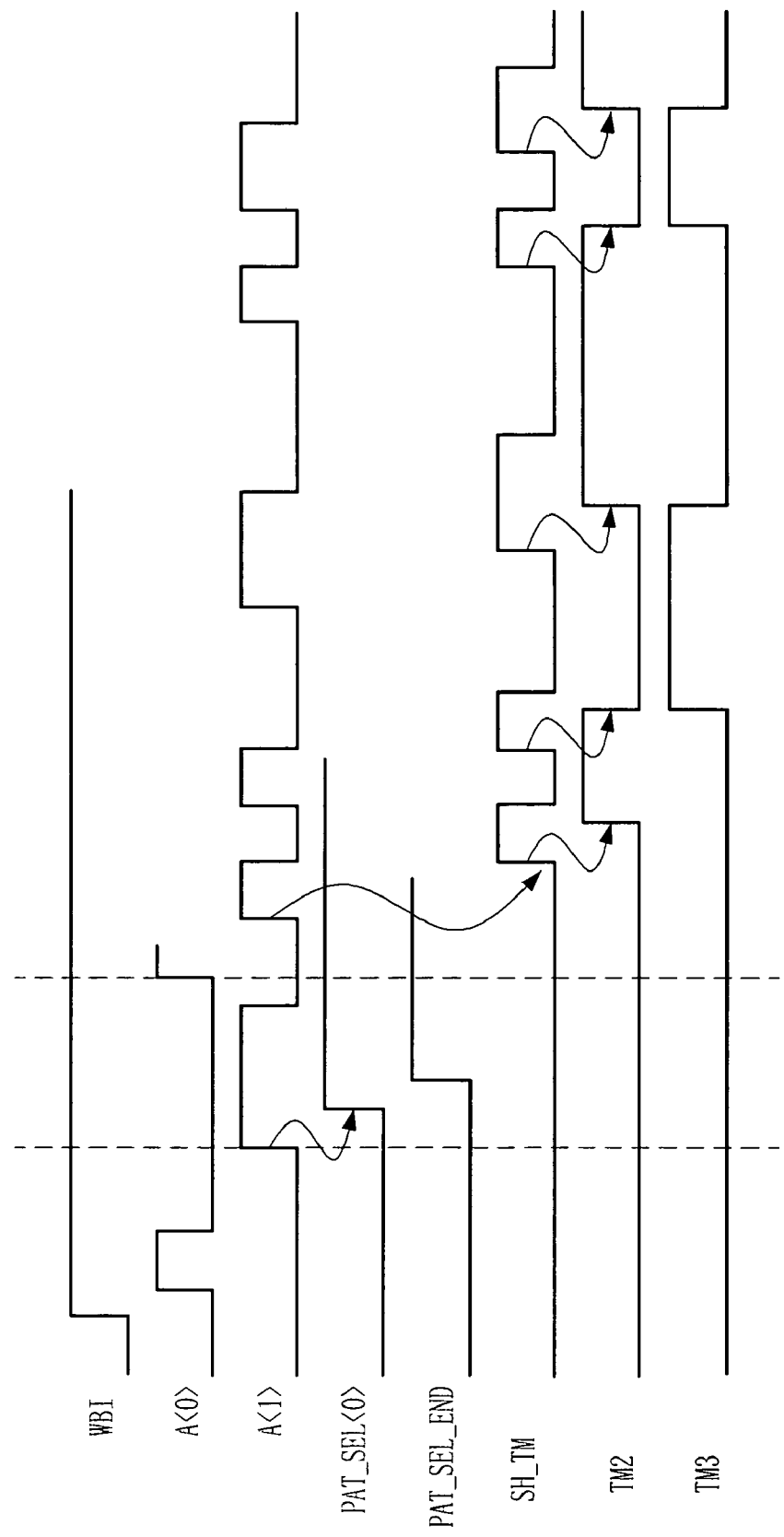
FIG. 5 is a timing diagram of a burn-in test of the semiconductor memory device illustrated in FIGS. 1 to 4.

FIG. 5 is a timing diagram of a burn-in test of the semiconductor memory device illustrated in FIGS. 1 to 4.

First, the first and second addresses A<0:1> are inputted through the first and second buffers 120 and 140. When the entry signal WBI is activated, the first and second input control units 220 and 240 receive the output signals of the first and second buffers 120 and 140 in response to the entry signal WBI to output the first and second test control signals WBI_A<0> and WBI_A<1>.

Upon operation of selecting the stress test pattern, the second address A<1> is locked to a logic low level and the first address A<0> is toggled predetermined times.

When the entry signal WBI is activated, the second address A<1> is locked to a logic low level. When the second address A<1> is activated to a logic high level after the first address A<0> is toggled a predetermined number of times, the corresponding stress test pattern is selected.

The pattern selector 300 activates corresponding ones of the pattern selection signal group PAT_SEL<0:3> according to the toggling number of the first test control signal WBI_A<0> while the second test control signal WBI_A<1> has a logic low level. That is, a logic state of the pattern selection signal group PAT_SEL<0:3> is determined by the toggling number of the first test control signal WBI_A<0> until the second test control signal WBI_A<1> becomes a logic high level. When the first test control signal WBI_A<0> is toggled one time, the first pattern selection signal PAT_SEL<0> is activated to a logic high level and then the selection end signal PAT_SEL_END is activated to a logic high level.

The shifting controller 400 outputs the shifting control signal SH_TM in a pulse form whenever the second test control signal WBI_A<1> is toggled in response to the activation of the selection end signal PAT_SEL_END.

The cell stress pattern control unit 520 of the pattern test signal generator 500 is enabled in response to the first pattern selection signal PAT_SEL<0>. The third and fourth test mode signals TM<2:3> for applying the stress to the cell are sequentially activated whenever the shifting control signal SH_TM is inputted. That is, the third test mode signal TM<2> is activated in response to a first toggling of the shifting control signal SH_TM, and the fourth test mode signal TM<3> is activated and the third test mode signal TM<2> is deactivated in response to a second toggling of the shifting control signal SH_TM. In addition, the third test mode signal TM<2> is activated and the fourth test mode signal TM<3> is deactivated in response to a third toggling of the shifting control signal SH_TM.

Therefore, the wafer burn-in test pattern can be selected using the signals inputted through the 2-bit address pads, and the test mode step can be performed. Since the number of pads for the test mode can be reduced, the stress can be applied to a large number of dies by one-time test using an external apparatus. Consequently, the test time in mass production can be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a pattern selector configured to output a plurality of pattern selection signals and a selection end signal based on first and second test control signals and an entry signal;
   a shifting controller configured to output a shifting control signal in response to the first and second test control signals and the selection end signal; and
   a pattern test signal generator configured to generate a plurality of test mode signals in response to the pattern selection signals and the shifting control signal, wherein the test mode signals control an entry into a test mode of said semiconductor memory device where a stress pattern produced by said pattern test signal generator corresponding to the pattern selection signals is applied to selected gate electrodes and bit lines of said semiconductor memory device.

2. The semiconductor memory device as recited in claim 1, wherein the entry signal comprises a flag signal indicating an entry into a wafer burn-in test.

3. The semiconductor memory device as recited in claim 1, wherein the pattern selector comprises:
   an end signal generating unit configured to generate the selection end signal in response to the pattern selection signals;
   a valid interval control unit configured to activate a valid interval signal in response to the second test control signal and deactivate the valid interval signal in response to the selection end signal;

a decoding unit reset in response to an inverted entry signal and configured to generate a plurality of decoding signals corresponding to a toggling number of the first test control signal during an activation of the second test control signal; and a selection signal generating unit configured to generate the plurality of pattern selection signals in response to the decoding signals and the valid interval signal, and deactivate the pattern selection signals in response to a deactivation of the entry signal.

4. The semiconductor memory device as recited in claim 3, wherein the end signal generating unit comprises:
a first OR gate configured to receive a first pattern selection signal and a second pattern selection signal;
a second OR gate configured to receive a third pattern selection signal and a fourth pattern selection signal; and
a third OR gate configured to receive output signals of the first OR gate and the second OR gate to output the selection end signal.

5. The semiconductor memory device as recited in claim 3, wherein the valid interval control unit comprises:
a delay element configured to delay the second test control signal;
a first inverter configured to invert an output signal of the delay element;
a NAND gate configured to receive an output signal of the first inverter and the second test control signal;
a second inverter configured to invert an output signal of the NAND gate;
a third inverter configured to invert the selection end signal; and
an AND gate configured to receive output signals of the second inverter and the third inverter to output the valid interval signal.

6. The semiconductor memory device as recited in claim 3, wherein the decoding unit comprises:
a first inverter configured to invert the second test control signal;
an AND gate configured to receive an output signal of the first inverter and a power supply voltage; and
first to fourth D flip-flops reset in response to the inverted entry signal and connected in series to receive an output signal of the AND gate or an output signal of a previous D flip-flop as a data input in synchronization with the first test control signal,
wherein output signals of the first to fourth D flip-flops are outputted as the first to fourth decoding signals; and
second to fifth inverters configured to invert the first to fourth decoding signals to output the decoding signals.

7. The semiconductor memory device as recited in claim 3, wherein the selection signal generating unit comprises:
a first pattern signal generating unit configured to activate a first pattern selection signal when a first decoding signal is activated during an activation of the valid interval signal, and deactivate the first pattern selection signal in response to the deactivation of the entry signal;
a second pattern signal generating unit configured to activate a second pattern selection signal when the first and a second decoding signals are activated during the activation of the valid interval signal, and deactivate the second pattern selection signal in response to the deactivation of the entry signal;
a third pattern signal generating unit configured to activate a third pattern selection signal when the first to a third decoding signals are activated during the activation of the valid interval signal, and deactivate the third pattern selection signal in response to the deactivation of the entry signal; and
a fourth pattern signal generating unit configured to activate a fourth pattern selection signal when the first to a fourth decoding signals are activated, and deactivate the fourth pattern selection signal in response to the deactivation of the entry signal.

8. The semiconductor memory device as recited in claim 7, wherein the first pattern signal generating unit comprises:
an input control unit configured to output a first input signal in response to an activation of the first decoding signal; and
a signal generating unit configured to output the first input signal as the first pattern selection signal during the activation of the valid interval signal.

9. The semiconductor memory device as recited in claim 8, wherein the input control unit comprises:
a first AND gate configured to receive the first decoding signal and an inverted second decoding signal;
a second AND gate configured to receive inverted third and fourth decoding signals; and
a third AND gate configured to receive output signals of the first and second AND gates to output the first input signal.

10. The semiconductor memory device as recited in claim 8, wherein the signal generating unit comprises:
a NAND gate configured to receive the valid interval signal and the first input signal;
an RS latch configured to receive an output signal of the NAND gate as a set signal and the entry signal as a reset signal; and
an inverter chain configured to delay a Q output of the RS latch to output the first pattern selection signal.

11. The semiconductor memory device as recited in claim 1, wherein the shifting controller comprises:
a D flip-flop configured to latch the selection end signal in response to the second test control signal; and
a signal output unit configured to output an output signal of the D flip-flop as the shifting control signal in response to the first test control signal.

12. The semiconductor memory device as recited in claim 11, wherein the signal output unit comprises:
a NAND gate configured to receive an output of the D flip-flop and the first test control signal; and
an inverter configured to invert an output signal of the NAND gate to output the shifting control signal.

13. The semiconductor memory device as recited in claim 1, wherein the pattern test signal generator comprises:
a cell stress pattern control unit enabled in response to a first pattern selection signal and configured to activate a third test mode signal and a fourth test mode signal in a predefined order so as to apply a stress to a memory cell whenever the shifting control signal is toggled;
an oxide-nitride-oxide (ONO) stress pattern control unit enabled in response to a second pattern selection signal and configured to activate the third test mode signal and the fourth test mode signal in a predefined order so as to apply a stress to a gate electrode of the memory cell whenever the shifting control signal is toggled;
a first bit line stress pattern control unit enabled in response to a third pattern selection signal and configured to activate an eighth test mode signal in a predefined order so as to apply a stress to a first bit line coupled to the memory cell whenever the shifting control signal is toggled; and a second bit line stress pattern control unit enabled in response to a fourth pattern selection signal and configured to activate second, fifth, sixth and seventh test mode signals in a predefined order so as to apply a stress to a second bit line coupled to the memory cell whenever the shifting control signal is toggled.

14. The semiconductor memory device as recited in claim 13, wherein the cell stress pattern control unit comprises:
a driving order control unit reset in response to the entry signal and configured to generate a plurality of driving order signals in response to the toggling number of the shifting control signal during the activation of the first pattern selection signal; and
a cell stress mode signal generating unit configured to output the corresponding test mode signals in response to the driving order signals.

15. The semiconductor memory device as recited in claim 14, wherein the driving order control unit comprises:
a pre-order signal generating unit configured to sequentially activate a plurality of pre-order signals during the activation of the first pattern selection signal in response to the toggling number of the shifting control signal;
a delay element configured to delay the shifting control signal by a predetermined time; and
an output control unit configured to output the pre-order signals as the driving order signals in response to an output signal of the delay element.

16. The semiconductor memory device as recited in claim 15, wherein the pre-order signal generating unit comprises:
an AND gate configured to receive the first pattern selection signal and the power supply voltage;
an inverter configured to invert the entry signal; and
first to sixth D flip-flops reset in response to an output signal of the inverter and connected in series to receive an output signal of the AND gate or an output signal of a previous D flip-flop as a data input to output the corresponding pre-order signals in synchronization with the shifting control signal.

17. The semiconductor memory device as recited in claim 15, wherein the output control unit comprises first to sixth signal generating units configured to output first to sixth pre-order signals as first to sixth driving order signals in response to the output signal of the delay element.

18. The semiconductor memory device as recited in claim 17, wherein the first signal generating unit comprises:
an AND gate configured to receive the output signal of the delay element and the first pre-order signal to output the first driving order signal; and
an inverter configured to invert an output signal of the AND gate to output the first driving order signal.

19. The semiconductor memory device as recited in claim 14, wherein the cell stress mode signal generating unit comprises first to sixth mode signal generating units configured to output the corresponding test mode signals in response to the driving order signals.

20. The semiconductor memory device as recited in claim 19, wherein the first mode signal generating unit comprises:

a first NAND gate configured to receive a first driving order signal and inverted second and third driving order signals;
a first inverter configured to invert an output signal of the first NAND gate;
a second NAND gate configured to receive inverted fourth to sixth driving order signals;
a second inverter configured to invert an output signal of the second NAND gate; and
an AND gate configured to receive output signals of the first and second inverters to output the third test mode signal.

21. The semiconductor memory device as recited in claim 20, further comprising:
a first buffer configured to receive a first external signal;
a second buffer configured to receive a second external signal;
a first input controller configured to receive an output signal of the first buffer to output the first test control signal in response to the entry signal; and
a second input controller configured to receive an output signal of the second buffer to output the second test control signal in response to the entry signal,
wherein the first external signal and the second external signal are inputted through address pins.

22. A method for driving a semiconductor memory device, comprising:
activating a flag signal indicating an entry into a wafer burn-in test;
selecting a stress pattern generated by a pattern test signal generator in response to a first test control signal and a second test control signal during the activation of the flag signal; and
controlling an entry into a test mode where the selected stress pattern is applied to selected gate electrodes and bit lines of said semiconductor memory device corresponding to the pattern selection signals is applied.

23. The method as recited in claim 22, wherein the selecting of the stress pattern comprises:
detecting a toggling number of the first test control signal until a rising time point of the second test control signal during the activation of the flag signal; and
selecting the stress pattern by generating a pattern selection signal corresponding to the toggling number of the first test control signal, and activating a selection end signal.

24. The method as recited in claim 23, wherein the controlling of the entry into the test modes comprises:
activating a shifting control signal in a pulse form according to a toggling of the second test control signal during an activation of the selection end signal; and
generating a test mode signal for entry into the test mode in response to the shifting control signal.

25. The method as recited in claim 22, wherein the first and second test control signals are first and second external signals inputted through address pins.

* * * * *